United States Patent
Namkung (10) Patent No.: US 9,570,527 B2
(45) Date of Patent: Feb. 14, 2017

(54) ORGANIC LIGHT EMITTING DIODE DISPLAY

(71) Applicant: Samsung Display Co., Ltd., Yongin (KR)

(72) Inventor: Jun Namkung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 75 days.

(21) Appl. No.: 14/063,702

(22) Filed: Oct. 25, 2013

(65) Prior Publication Data
US 2015/0001477 A1 Jan. 1, 2015

(51) Int. Cl.
H01L 27/32 (2006.01)

(52) U.S. Cl.
CPC ... H01L 27/3258 (2013.01); *H01L 2251/5338* (2013.01)

(58) Field of Classification Search
CPC ...... H01L 27/28; H01L 27/32; H01L 27/3211; H01L 27/3216; H01L 27/3218; H01L 27/3258; H01L 27/326; H01L 51/5203; H01L 51/5209; H01L 51/5225
See application file for complete search history.

(56) References Cited

U.S. PATENT DOCUMENTS

| | | | |
|---|---|---|---|
| 8,229,522 B2 | 7/2012 | Kim et al. | |
| 2010/0109511 A1* | 5/2010 | Kim et al. | 313/504 |
| 2010/0327297 A1* | 12/2010 | Yoshida et al. | 257/89 |
| 2011/0121719 A1* | 5/2011 | Yokoyama | H01L 27/3248 313/504 |
| 2013/0001603 A1* | 1/2013 | Lim et al. | 257/88 |
| 2013/0002133 A1* | 1/2013 | Jin et al. | 313/511 |
| 2013/0099258 A1* | 4/2013 | Lim et al. | 257/88 |
| 2014/0312319 A1* | 10/2014 | Kim | 257/40 |
| 2016/0021718 A1* | 1/2016 | Kikuchi | H01L 51/5271 362/231 |

FOREIGN PATENT DOCUMENTS

JP 10-233982 9/1998
KR 10-2001-0009748 2/2001

* cited by examiner

*Primary Examiner* — Stephen W Smoot
*Assistant Examiner* — Sun M Kim
(74) *Attorney, Agent, or Firm* — H.C. Park & Associates, PLC (57) ABSTRACT

An organic light emitting diode display may include a front display part including a plurality of front pixels formed on a substrate and realizing an image at a front and a side display part. A side pixel of the side display part may include: a plurality of thin film transistors formed on the substrate; a protective layer covering the plurality of thin film transistor and having an inclination groove that is oblique; a first electrode formed at the inclination groove of the protective layer; a pixel defining layer having an opening exposing the first electrode and formed on the protective layer; an organic emission layer formed on the first electrode and the pixel defining layer; and a second electrode covering the organic emission layer.

17 Claims, 9 Drawing Sheets

ORGANIC LIGHT EMITTING DIODE DISPLAY

CROSS REFERENCE TO RELATED APPLICATION

This application claims priority from and the benefit of Korean Patent Application No. 10-2013-0076610, filed on Jul. 1, 2013, which is hereby incorporated by reference for all purposes as if fully set forth herein.

BACKGROUND

Field

Exemplary embodiments of the present disclosure relate to an organic light emitting diode (OLED) display.

Description of the Background

An organic light emitting diode display includes two electrodes and an organic light emitting member disposed therebetween. Electrons injected from one electrode and holes is injected from the other electrode are combined in the organic light emitting member to form excitons, and light is emitted as the excitons release energy.

For applying the OLED display to various types of applications, a flexible OLED display is manufactured to be flexible. In flexible OLED displays, a bendable OLED display is bent at an edge, thereby having a structure in which a front display part is realized without dead space and simultaneously a side display part that can be visible at a side is realized.

However, the bendable OLED display is manufactured with reference to the front display part such that maximum luminance may be obtained at a viewing angle of 0 degrees, that is, at the front side, but the luminance is sharply deteriorated at the bending display part.

The above information disclosed in this Background section is provided to enhance understanding of the background of the present disclosure and therefore may contain information that does not form prior art that is already known to a person of ordinary skill in the art.

SUMMARY

Exemplary embodiments of the present disclosure provide an organic light emitting diode (OLED) display with improved luminance of a side display part.

Additional features of the present disclosure will be set forth in the description which follows, and in part will be apparent from the description, or may be learned by practice of the disclosed subject matter.

Exemplary embodiments of the present disclosure disclose an organic light emitting diode (OLED) display including a front display part and a side display part. The front display part includes a plurality of front pixels configured to provide an image at a first side of is the OLED display. The side display part includes a plurality of side pixels configured to provide the image at a second side of the OLED display. Each side pixel includes: a plurality of thin film transistors; a protective layer covering the plurality of thin film transistors and having an oblique inclination groove; a first electrode formed at the inclination groove; a pixel definition layer disposed on the protective layer and having an opening exposing the first electrode; an organic emission layer disposed on the first electrode and the pixel definition layer; and a second electrode disposed on the organic emission layer. A side OLED includes the first electrode, the organic emission layer, and the second electrode, and is configured to be oblique.

Exemplary embodiments of the present disclosure also disclose a pixel. The pixel includes at least one switching element, a protective layer, and an organic light emitting diode. The protective layer is disposed on the at least one switching element. The protective layer has a top surface inclined at an inclination angle relative to a bottom surface of the protective layer. The OLED is disposed on the protective layer and includes a bottom electrode. The bottom electrode is inclined at the inclination angle and is connected to the at least one switching element.

Exemplary embodiments of the present disclosure also disclose an organic light emitting diode (OLED) display including a front display part, a side display part, and a bending display part connecting the front display part and the side display part. Each of the front display part, the side display part, and the bending display part includes a plurality of pixels. Each of the pixels includes at least one switching element, a protective layer disposed on the at least one switching element, and an OLED disposed on the protective layer. In pixels of the front display part, a top surface of the OLED is parallel to a surface of the protective layer. In a pixel of the side display part or the bending display part, a top surface of the protective layer is inclined at an is inclination angle with respect to a bottom surface of the protective layer, and a top surface of the OLED is inclined with respect to the bottom surface of the protective layer.

Exemplary embodiments of the present disclosure also disclose an organic light emitting diode (OLED) display including a front display part, a side display part, and a bending display part connecting the front display part and the side display part. The front display part includes a plurality of first pixels, and the side display part and the bending display part includes a plurality of second pixels. Each of the plurality of second pixels includes an OLED with an inclined surface. An inclination angle of the inclined surface corresponds to a location of the OLED.

It is to be understood that both the foregoing general description and the following detailed description are exemplary and explanatory and are intended to provide further explanation of the disclosed subject matter as claimed.

BRIEF DESCRIPTION OF THE DRAWINGS

The accompanying drawings, which are included to provide a further understanding of the disclosed subject matter and are incorporated in and constitute a part of this specification, illustrate exemplary embodiments of the disclosed subject matter, and together with the description serve to explain the principles of the disclosed subject matter.

DETAILED DESCRIPTION OF THE ILLUSTRATED EMBODIMENTS

The disclosed subject matter is described more fully hereinafter with reference to the accompanying drawings, in which exemplary embodiments of the disclosed subject matter are shown. This disclosed subject matter may, however, be embodied in many different forms and should not be construed as limited to the exemplary embodiments set forth herein. Rather, these exemplary embodiments are provided so that this disclosure is thorough, and will fully convey the scope of the disclosed subject matter to those skilled in the art. In the drawings, the is size and relative sizes of layers and regions may be exaggerated for clarity Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary is term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the disclosed subject matter. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the disclosed subject matter are described herein with reference to cross-section illustrations that are schematic illustrations of idealized embodiments (and intermediate structures) of the disclosed subject matter. As such, variations from the shapes of the illustrations as a result, for example, of manufacturing techniques and/or tolerances, are to be expected. Thus, exemplary embodiments of the disclosed subject matter should not be construed as limited to the particular shapes of regions illustrated herein but are to include deviations in shapes that result, for example, from manufacturing.

Hereinafter, exemplary embodiments of the disclosed subject matter will be described in detail with reference to the accompanying drawings.

An OLED display according to exemplary embodiments of the present disclosure will now be described in detail with reference to FIGS. 1, 2, and 3.

Figure 1:
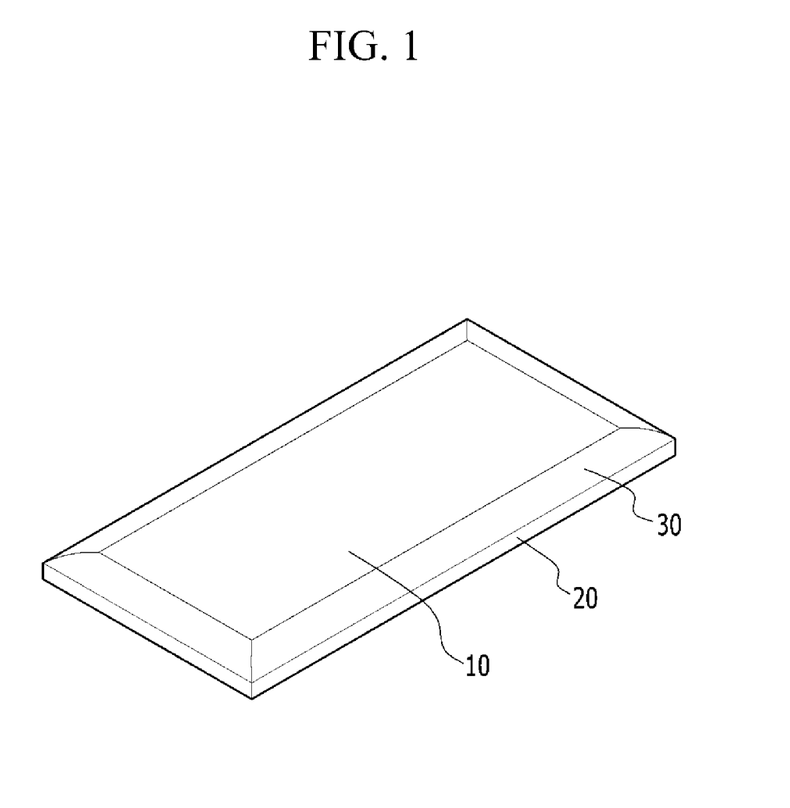
FIG. 1 is a perspective view of an OLED display according to exemplary embodiments of the present disclosure.

FIG. 1 is a perspective view of an OLED display according to the exemplary is embodiments of the present disclosure. FIG. 2 is a side view of an OLED display according to exemplary embodiments of the present disclosure.

Figure 2:
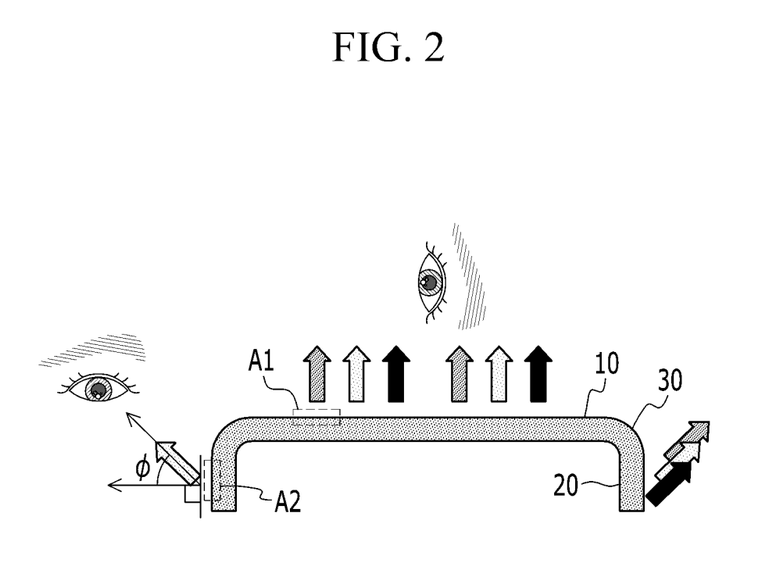
FIG. 2 is a side view of an OLED display according to exemplary embodiments of the present disclosure.

As shown in FIG. 1 and FIG. 2, an OLED display may include a front display part 10 configured to realize an image at a front side of the OLED display, a side display part 20 configured to realize an image at one or more side portions of the OLED display, and a bending display part 30 formed between the front display part 10 and the side display part 20. The bending display part 30 may be bent. The side portions of the OLED display including the side display part 20 may be formed at an angle (e.g., 90°) relative to the surface of the front side of the OLED display. The OLED display including the front display part 10, the bending display part 30, and the side display part 20 may be formed such that there is no dead space (i.e., space where an image is not realized).

As shown in FIG. 2, the front display part 10 may have a maximum luminance at a front side of the OLED display where the viewing angle φ is 0 degrees. The side display part 20 and the bending display part 30 may have maximum luminance at a viewing angle φ so that a user may easily view the side display part 20 and the bending display part 30. The viewing angle φ may be in a range from 5° to 70°.

A detailed structure of a pixel that may be used as a front pixel A1 formed at the front display part 10 and/or a side pixel A2 formed at the side display part 20 and the bending display part 30 is described with reference to FIGS. 3, 4, and 5.

Figure 3:
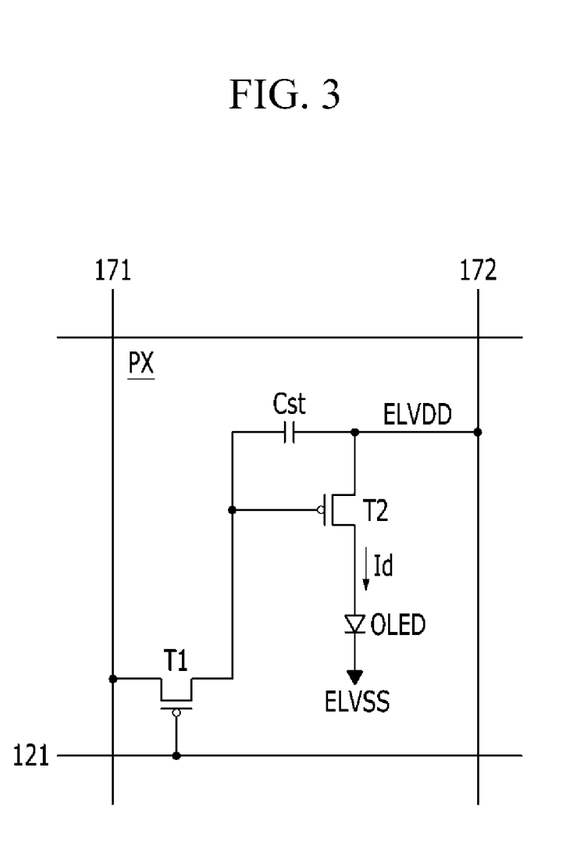
FIG. 3 is an equivalent circuit of one pixel of an OLED display according to is exemplary embodiments of the present disclosure.

FIG. 3 is an equivalent circuit of one pixel of the OLED display according to exemplary embodiments of the present disclosure. A pixel may refer to a minimum unit configured to display an image. The OLED display may include a plurality of pixels. The pixel in the OLED display may be implemented using various suitable structures. In some cases, the is pixel may include a plurality of TFTs and at least one capacitor. For example, as shown in FIG. 3, a 2Tr-1Cap structured active matrix (AM) type of OLED display in which the pixel includes two thin film transistors (TFT) and one capacitor may be used.

As shown in FIG. 3, a pixel PX, representative of the front pixel A1 and the side pixel A2 of the OLED display, may include a plurality of signal lines 121, 171, and 172. A plurality of pixels PX may be connected to the signal lines 121, 171, and 172, and may be arranged in a matrix-like manner.

The signal lines 121, 171, and 172 include a scan line 121 configured to carry a scan signal (or a gate signal), a data line 171 configured to carry a data signal, and a driving voltage line 172 configured to carry a driving voltage ELVDD. The scan lines 121 run parallel with each other in a row direction, and the data lines 171 and the driving voltage lines 172 run parallel with each other in a column direction. The column direction may be approximately perpendicular to the row direction. The pixel PX includes a switching thin film transistor T1, a driving thin film transistor T2, a storage capacitor Cst, and an OLED.

The switching thin film transistor T1 has a control terminal, an input terminal, and an output terminal. The control terminal is connected to the scan line 121, the input terminal is connected to the data line 171, and the output terminal is connected to the driving thin film transistor T2. The switching thin film transistor T1 may provide a data signal applied to the data line 171 to the driving thin film transistor T2 when the switching thin film transistor T1 is turned on in response to a scan signal applied to the scan lines 121.

The driving thin film transistor T2 also has a control terminal, an input terminal, and an output terminal. The control terminal is connected to the output terminal of the switching thin film transistor T1, the input terminal is connected to the driving voltage line 172, and the is output terminal is connected to the organic light emitting diode OLED. When the driving thin film transistor T2 is turned on, an output current Id may flow and may vary in amplitude in accordance with a voltage applied between the control terminal and the output terminal of the driving thin film transistor T2.

The storage capacitor Cst is connected between the control terminal and input terminal of the driving thin film transistor T2. The storage capacitor Cst charges a data signal applied to the control terminal of the driving thin film transistor T2, and may maintain a voltage corresponding to a voltage level of the data signal after the switching thin film transistor T1 is turned off.

The organic light emitting diode OLED has an anode connected to the output terminal of the driving thin film transistor T2 and a cathode connected to a common voltage ELVSS. The organic light emitting diode OLED may display an image by emitting light with different intensities according to the output current Id of the driving thin film transistor T2.

In some cases, the switching thin film transistor T1 and the driving thin film transistor T2 may be n-channel field effect transistors (FETs) or p-channel field effect transistors. However, it should be understood that the transistors T1 and T2 may be implanted using various types of transistors and that the transistors T1 and T2 are not limited to nFETs or pFETs. In addition, the connections among the thin film transistors T1 and T2, the storage capacitor Cst, and the organic light emitting diode OLED may vary.

A detailed structure of the front pixel A1 and the side pixel A2 of the OLED display will now be described in further detail with reference to FIGS. 3, 4, 5, and 6.

Figure 4:
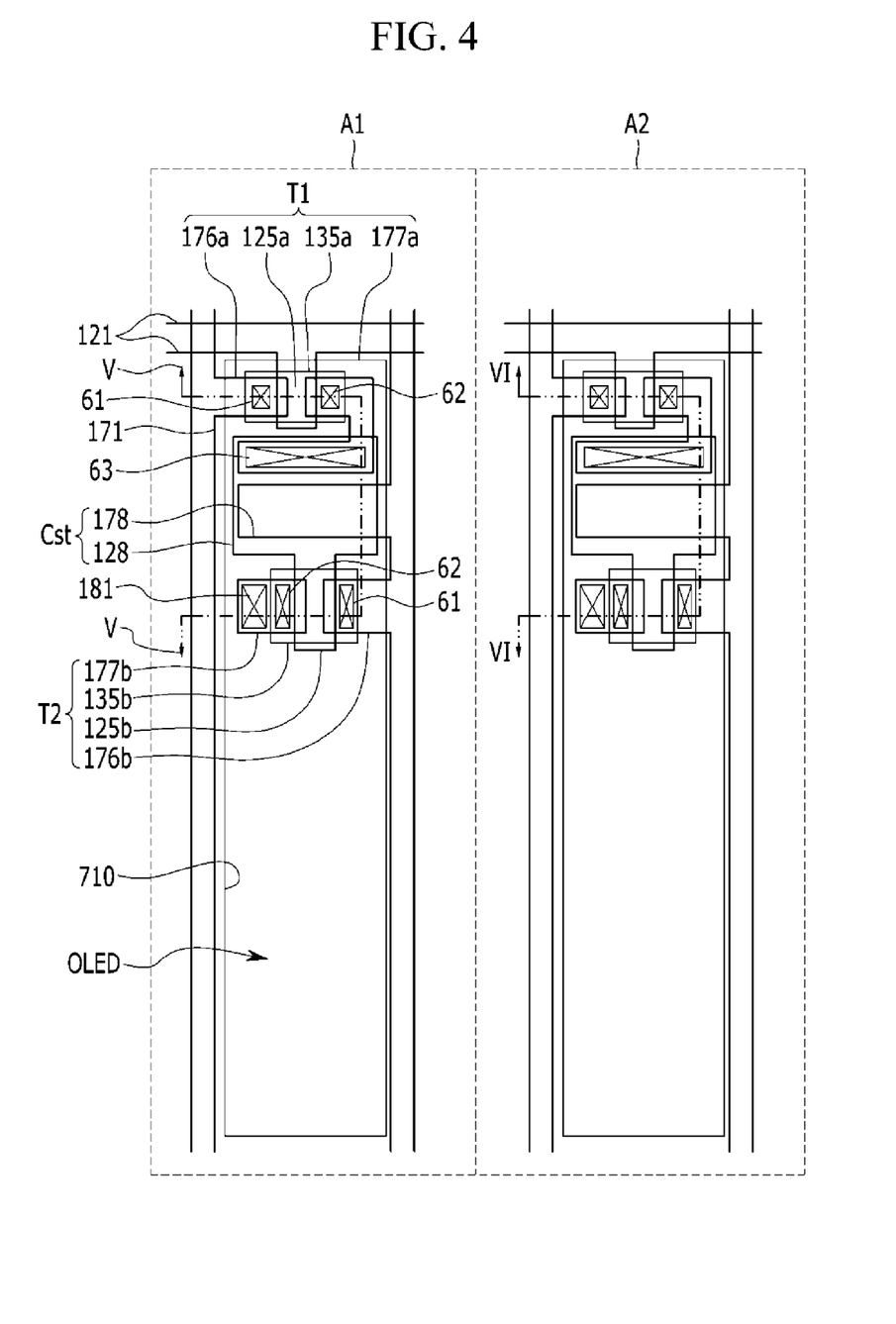
FIG. 4 is a layout view of one pixel respectively positioned at a front display part and a side display part of an OLED display according to exemplary embodiments of the present disclosure.

FIG. 4 is a layout view a front pixel A1 positioned at a front display part 10 and a side pixel A2 positioned at a side display part 20 of the OLED display according to exemplary is embodiments of the present disclosure. FIG. 5 is a cross-sectional view taken along the line V-V of FIG. 4, and FIG. 6 is a cross-sectional view taken along the line VI-VI of FIG. 4.

A buffer layer 120 may be formed on a substrate 110 of the front pixel A1 and the side pixel A2. The substrate 110 may be an insulating substrate made of glass, quartz, ceramic, or plastic. The buffer layer 120 may have a single-layered structure of silicon nitride (SiNx), or a double-layered structure of silicon nitride (SiNx) and silicon oxide ($SiO_2$). The buffer layer 120 may prevent unwanted components, such as impure elements or moisture, from intruding into the substrate 110, while simultaneously flattening a surface of the substrate 110.

A switching semiconductor layer 135a and a driving semiconductor layer 135b may be disposed on the buffer layer 120 and may be spaced apart from each other. These semiconductor layers 135a and 135b may be made of polysilicon or an oxide semiconductor. The oxide semiconductor may include a material selected from the group consisting of oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof, such as zinc oxide (ZnO), indium-gallium-zinc oxide (InGaZnO4), indium-zinc oxide (Zn—In—O), zinc-tin oxide (Zn—Sn—O), indium-gallium oxide (InGa—O), indium-tin oxide (In—Sn—O), indium-zirconium oxide (InZr—O), indium-zirconium-zinc oxide (InZr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). If the semiconductor layers 135a and 135b are made of an oxide semiconductor, a separate protective layer may be added to protect the oxide semiconductor from external environmental elements, such as high temperature.

Each of the semiconductor layers 135a and 135b may include a channel region 1355 not doped with impurities, and source region 1356 and drain region 1357 formed of polysilicon doped with conductive impurities (e.g., impurity semiconductors) and formed at respective sides of the channel region 1355. The impurities vary according to the type of thin film transistor the semiconductor layers 135a and 135b are parts of, and may be N-type impurities or P-type impurities. For instance, if the transistor T1 is a nFET, the drain region 1357 and the source region 1356 of the semiconductor layer 135a may be doped with N-type impurities. If the transistor T1 is a pFET, the drain region 1357 and source region 1356 of the semiconductor layer 135a may be doped with p-type impurities.

A gate insulating film 140 is disposed on the switching semiconductor layer 135a, the driving semiconductor layer 135b, and the buffer layer 120. The gate insulating film 140 may be a single layer or a plurality of layers containing at least one of silicon nitride and silicon oxide.

The scan line 121, a driving gate electrode 125b, and a first storage capacitor plate 128 are formed on the gate insulating film 140. The scan line 121 extends in a horizontal direction and may carry a scan signal. The scan line 121 may include a switching gate electrode 125a protruding from the scan line 121 toward the switching semiconductor layer 135a. The driving gate electrode 125b may protrude from the first storage capacitor plate 128 toward the driving semiconductor layer 135b. The switching gate electrode 125a and the driving gate is electrode 125b overlap the channel regions 1355, respectively.

An interlayer insulating film 160 is formed on the scan line 121, the driving gate electrode 125b, and the first storage capacitor plate 128. The interlayer insulating film 160 may be formed of silicon nitride or silicon oxide.

Source contact holes 61 and drain contact holes 62 are formed in the interlayer insulating film 160 and the gate insulating film 140 to expose the source regions 1356 and the drain regions 1357. Storage contact holes 63 are formed in the interlayer insulating film 160 to expose part of the first storage capacitor 128.

A data line 171 having a switching source electrode 176a, a driving voltage line 172 having a driving source electrode 176b and a second storage capacitor plate 178, and a switching drain electrode 177a and a driving drain electrode 177b that are connected to the first storage capacitor plate 128a are formed on the interlayer insulating film 160.

The data line 171 may carry a data signal, and may extend in a direction crossing the gate line 121. The driving voltage line 172 may carry a driving voltage, may be separated from the data line 171, and may extend in the same direction as the data line 171.

The switching source electrode 176a protrudes from the data line 171 toward the switching semiconductor layer 135a, and the driving source electrode 176b protrudes from the driving voltage line 172 toward the driving semiconductor layer 135b. The switching source electrode 176a and the source electrode 176b are respectively connected to the source regions 1356 through the source contact holes 61. The switching drain electrode 177a faces the switching source electrode 176a, the driving drain electrode 177b faces the driving source electrode 176b, and the switching drain electrode 177a and the driving drain electrode 177b are respectively connected to the drain regions 1357 through the drain contact holes 62.

The switching drain electrode 177a is extended and electrically connected to the first storage capacitor plate 128 through the storage contact hole 63 and the driving gate electrode 125b.

The second storage capacitor plate 178 protrudes from the driving voltage line 171, and overlaps the first storage capacitor plate 128. Accordingly, the first storage capacitor plate 128 and the second storage capacitor plate 178 constitute the storage capacitor Cst by using the interlayer insulating film 160 as a dielectric material.

The switching semiconductor layer 135a, the switching gate electrode 125a, the switching source electrode 176a, and the switching drain electrode 177a constitute the switching thin film transistor T1, and the driving semiconductor layer 135b, the driving gate electrode 125a, the driving source electrode 176b, and the driving drain electrode 177b constitute the driving thin film transistor T2.

A protective layer 180 is disposed on the switching source electrode 176a, the driving source electrode 176b, the switching drain electrode 177a, the driving drain electrode 177b, and the second storage capacitor plate 178. The protective layer 180 may be made of at least one material of acryls resin (polyacrylates resin), epoxy resin, phenolic resin, polyamides resin, polyimides rein, unsaturated polyesters resin, polyphenylenethers resin, polyphenylenesulfides resin, and benzocyclobutene (BCB).

In some cases, as shown in FIG. 6, an inclination groove 182 having an inclination angle θ may be formed at the protective layer 180 of the side pixel A2. In some cases, the inclination angle θ may be between 5° and 70°. However, it should be understood that various inclination angles may be possible.

A pixel electrode 710 may be disposed on the protective layer 180, and may be formed at the inclination groove 182 of the protective layer 180 in the side pixel A2 at an oblique angle (e.g., between 5° and 70°). The pixel electrode 710 may be made of a transparent conducting material, such as ITO (indium tin oxide), IZO (indium zinc oxide), ZnO (zinc oxide), or $In_2O_3$ (indium oxide), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 710 may be electrically connected to the driving drain electrode 177b of the driving thin film transistor T2 through a contact hole 181 formed in the interlayer insulating film 160, and may operate as an anode of the organic light emitting diode.

A pixel defining layer 350 may be disposed on edge portions of the pixel electrode 710 and the protective layer 180. The pixel defining layer 350 may have an opening 351 exposing the pixel electrode 710. The pixel defining layer 350 may be made of a resin such as polyacrylate resin or polyimide resin, a silica-based inorganic material, or the like.

An organic emission layer 720 may be disposed in the opening 351 of the pixel defining layer 350. The organic emission layer 720 may be disposed on the pixel electrode 710 formed at the inclination groove 182 such that the organic emission layer 720 has the same inclination angle θ as the inclination angle θ of the pixel electrode 710.

The organic emission layer 720 may include a plurality of layers including one or more of an emission layer, a hole injection layer (HIL), a hole transport layer (HTL), an electron transport layer (ETL), and an electron injection layer (EIL). When the organic emission layer 720 includes all of them, the hole injection layer (HIL) can be placed on the pixel electrode 710, that is, the anode, and the hole transport layer (HTL), the emission layer, the electron transport layer (ETL), and the electron injection layer (EIL) can be sequentially stacked over the hole is injection layer (HIL).

The organic emission layer 720 may include a red organic emission layer for emitting red light, a green organic emission layer for emitting green light, and a blue organic emission layer for emitting blue light. The red organic emission layer, the green organic emission layer, and the blue organic emission layer are respectively formed in red, green, and blue pixels, thereby displaying a color image.

In some cases, the red organic emission layer, green organic emission layer, and blue organic emission layer of the organic emission layer 720 may be respectively laminated on the red pixel, green pixel, and blue pixel, and a red color filter, a green color filter, and a blue color filter may be formed for the respective pixels, thereby displaying a color image. In some cases, a white organic emission layer for emitting white light may be formed on all of the red, green, and blue pixels, and a red color filter, a green color filter, and a blue color filter may be formed for the respective pixels, thereby displaying a color image. If the white organic emission layer and the color filters are used to display a color image, there is no need to use a deposition mask for depositing the red, green, and blue organic emission layers on the respective pixels, i.e., the red, green, and blue pixels.

The white organic emission layer may be formed as one organic emission layer or a plurality of organic emission layers that are laminated to emit white light. For example, at least one yellow organic emission layer and at least one blue organic emission layer may be combined to emit white light, at least one cyan organic emission layer and at least one red organic emission layer may be combined to emit white light, or at least one magenta organic emission layer and at least one green organic emission layer may be combined to emit white light.

A common electrode 730 may be disposed on the pixel defining layer 350 and the is organic emission layer 720. The common electrode 730 may be disposed on the pixel electrode 710 and the organic emission layer 720 formed at the inclination groove 182 such that the common electrode 730 has the same inclination angle θ as the inclination angle θ of the pixel electrode 710.

The common electrode 730 may be made of a transparent conducting material such as ITO (indium tin oxide), IZO (indium zinc oxide), ZnO (zinc oxide), or $In_2O_3$ (indium oxide), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 730 may function as a cathode of the organic light emitting diode OLED. The pixel electrode 710, the organic emission layer 720, and the common electrode 730 constitute the side OLED 70. The pixel electrode 710, the organic emission layer 720, and the common electrode 730 formed at the side pixel A2 have the same inclination angle θ such that the surfaces thereof are parallel to each other. In some cases, the inclination angle θ may be between 5° and 70°. However, it should be understood that various inclination angles may be possible.

As described above, the side OLED 70 including the pixel electrode 710, the organic emission layer 720, and the common electrode 730 formed at the side pixel A2 has the inclination angle θ such that the side display part 20 and the bending display part 30 formed at the side pixel A2 may have the maximum luminance at the viewing angle ϕ.

A manufacturing method of the OLED display according to exemplary embodiments of the present disclosure will be described with reference to FIG. 5 and FIG. 6.

Figure 5:
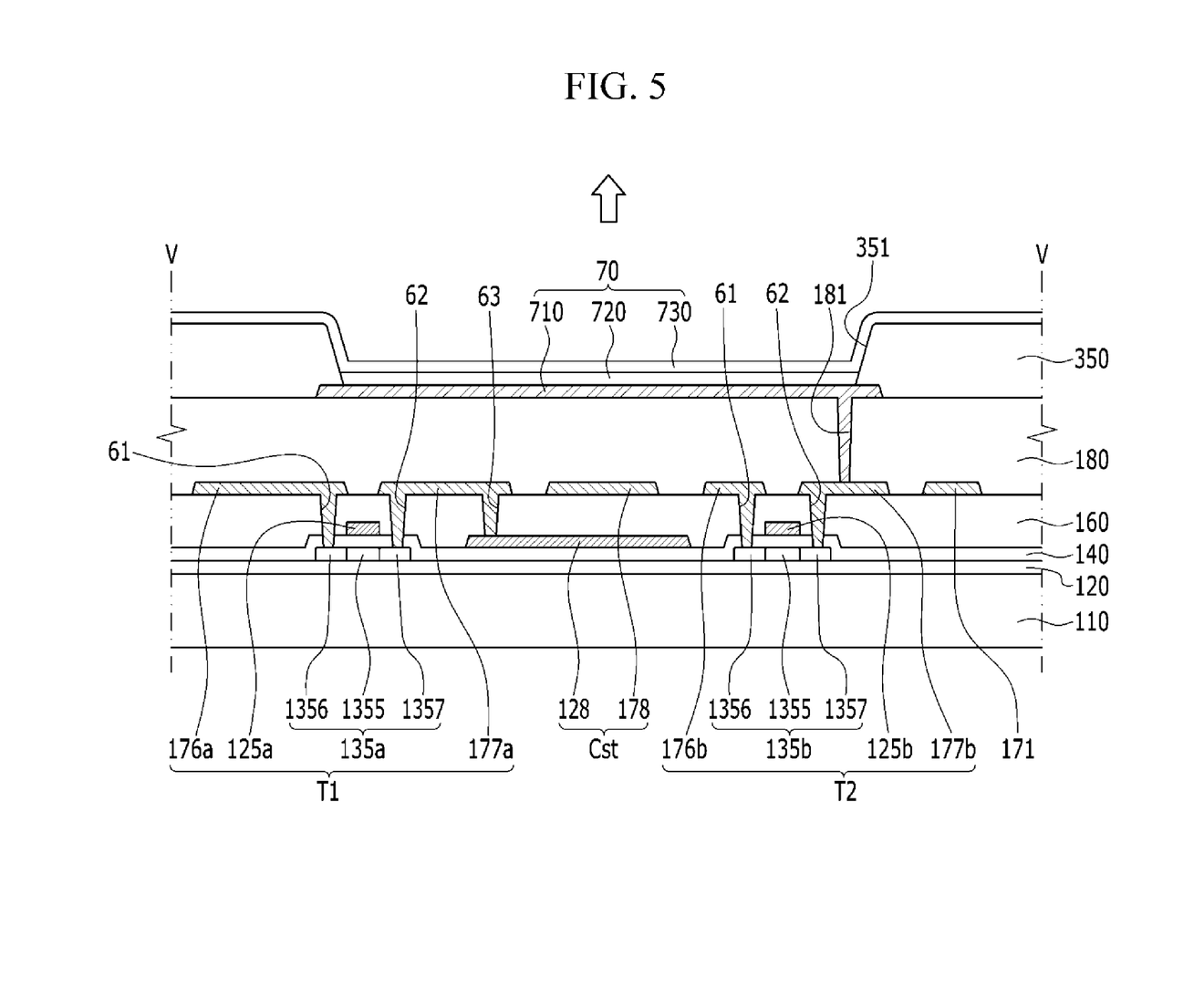
FIG. 5 is a cross-sectional view taken along the line V-V of FIG. 4 according to exemplary embodiments of the present disclosure.
Figure 6:
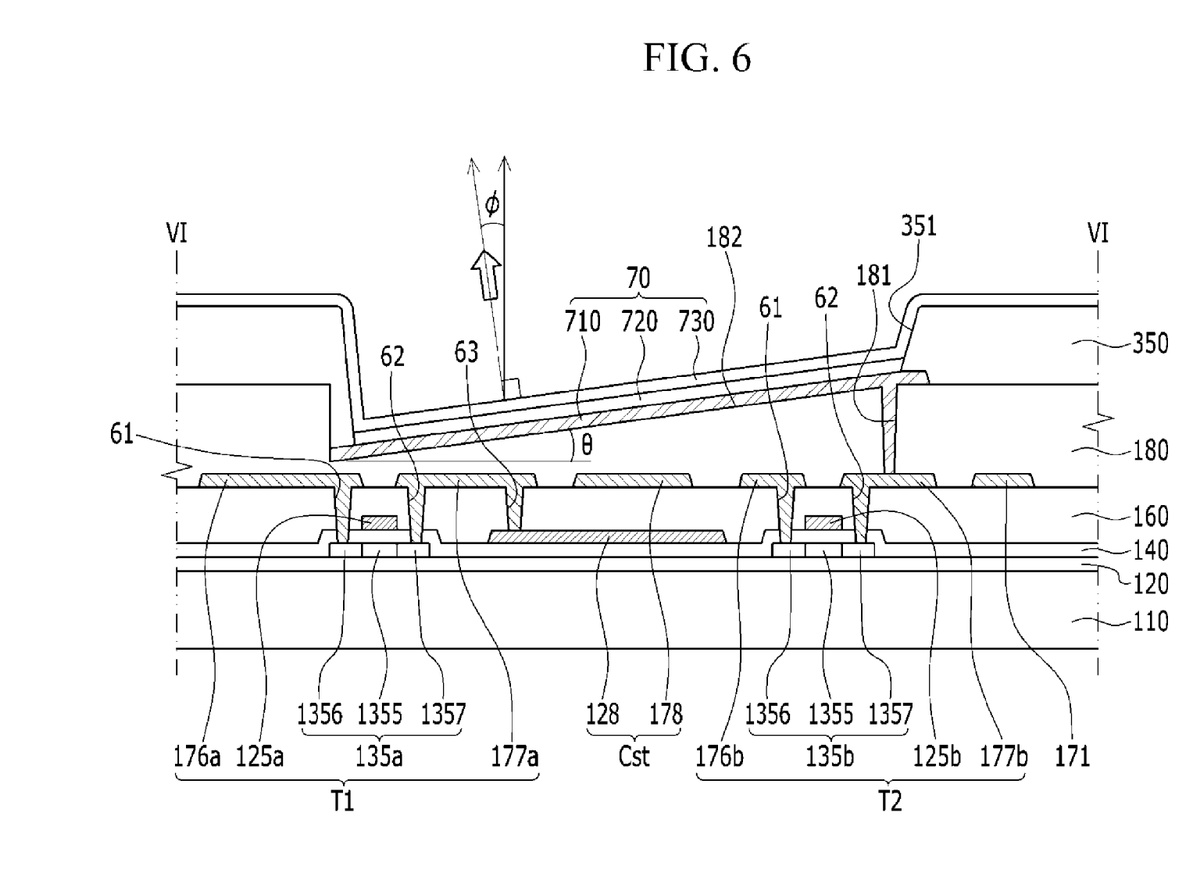
FIG. 6 is a cross-sectional view taken along the line VI-VI of FIG. 4 according to exemplary embodiments of the present disclosure.

As shown in FIG. 5 and FIG. 6, the buffer layer 120 is disposed on the substrate 110 of the front pixel A1 and the side pixel A2. In some cases, the buffer layer 120 may be is disposed over the entire surface of the substrate 10 by a method such as plasma enhanced chemical vapor deposition (PECVD). Next, a semiconductor layer may be disposed on the buffer layer 120. The semiconductor layer may be made of polysilicon or an oxide semiconductor, and the polysilicon may be formed by forming an amorphous silicon film and then crystallizing it. Various methods may be used to crystallize the amorphous silicon film. For example, the amorphous silicon film may be crystallized using heat, a laser, Joule heat, an electrical field, or a catalytic metal. Next, the semiconductor layer may be patterned by photolithography by using a first mask. In some cases, the switching semiconductor layer 135a and the driving semiconductor layer 135b may be simultaneously formed.

Next, the gate insulating film 140 may be disposed on the switching semiconductor layer 135a, the driving semiconductor layer 135b, and the buffer layer 120. The gate insulating film 140 may be formed of silicon nitride (SiNx) or silicon oxide ($SiO_2$), and may be deposited over the entire surface of the buffer layer 120 by a method such as PECVD.

Next, a gate metal layer may be disposed on the gate insulating film 140. The gate metal layer may be formed as a multilayer film in which a metal film including one of copper (Cu), a copper alloy, aluminum (Al), and an aluminum alloy and a metal film including either one of molybdenum (Mo) and a molybdenum alloy are laminated. Next, the gate metal layer may be patterned by photolithography using a second mask. As such, the switching gate electrode 125a may be formed at a position overlapping the switching semiconductor layer 135, the driving gate electrode 125b may be formed at a position overlapping the driving semiconductor layer 135b, and the first storage capacitor plate 128 may be connected to the driving gate electrode 125b. Next, the switching semiconductor layer 135a and the driving semiconductor layer 135b may be doped with impurities, and may be divided into a channel region, a source region, and a drain region. The switching gate electrode 125a and the driving gate electrode 125b prevent the channel regions from being doped with impurities when the source regions and the drain regions are doped with impurities.

Next, an interlayer insulating film 160 may be disposed on the gate insulating film 140, the switching gate electrode 125a, and the driving gate electrode 125b. The interlayer insulating film 160 may be an organic or inorganic film, and may be deposited over the entire surface of the substrate 110. Next, the interlayer insulating film 160 and the gate insulating film 140 may be patterned by photolithography using a third mask to form a plurality of contact holes 61, 62, and 63.

Next, a data metal layer may be disposed on the interlayer insulating film 160. The data metal layer may be formed as a multilayer film in which a metal film including one of copper (Cu), a copper alloy, aluminum (Al), and an aluminum alloy and a metal film including either one of molybdenum (Mo) and a molybdenum alloy are laminated. For example, the data metal layer may be formed of a three-layered film of Mo/Al/Mo or a three-layered film of Mo/Cu/Mo.

Next, the data metal layer film may be patterned by photolithography using a fourth mask. As such, a data wire including the data line 171 having the switching source electrode 176a, the driving voltage line 172 having the driving source electrode 176b and the second storage capacitor plate 178, and the switching drain electrode 177a and the driving drain electrode 177b that are connected to the first storage capacitor plate 128 are formed on the interlayer insulating film 160.

Next, the protective layer 180 may be disposed on the interlayer insulating film 160 to cover the data wires 171, 172, 174, 177a, and 177b. The contact hole 181 may be formed is in the protective layer 180 in the front pixel A1 and the side pixel A2 by a photolithography process using a fifth mask; however, in the side pixel A2, the protective layer 180 is formed with the inclination groove 182 having inclination angle θ by photolithography using a gradual half tone mask part of the fifth mask.

Next, a pixel electrode layer may be disposed on the protective layer 180, and the pixel electrode layer may be patterned by photolithography using a sixth mask to form the pixel electrode 710 connected to the driving drain electrode 177b through the contact hole 181. In the side pixel A2, the pixel electrode 710 disposed on the inclination groove 182 is formed to have the inclination angle θ. A deposition speed, a deposition temperature, a deposition voltage, and a deposition pressure of the pixel electrode layer may be controlled to form the pixel electrode 710 with a uniform thickness to be oblique.

Next, the pixel defining layer 350 may be disposed on the protective layer 180 to cover the pixel electrode 710, and the opening 351 is formed on the pixel defining film 350 by using a seventh mask to expose part of the pixel electrode 710.

The organic emission layer 720 may be disposed on the pixel electrode 710 in the opening 351 of the pixel defining layer 350, and the common electrode 730 may be disposed on the organic emission layer 720. The organic emission layer 720 and the common electrode 730 formed at the inclination groove 182 may have the inclination angle θ.

As described above, by forming the side OLED 70 including the pixel electrode 710, the organic emission layer 720, and the common electrode 730 to have the inclination angle θ at the side pixel A2, light emitted from the side display part 20 and the bending display part 30 in which the side pixel A2 is formed may have the maximum luminance at the viewing angle ϕ.

As described above, one inclination groove 182 may be formed at one side pixel A2 of the OLED display such that the side OLED 70 has one inclination angle. However, in some cases, a plurality of sub-inclination grooves may be formed in one side pixel A2 to have a plurality of inclination angles in the side OLED 70.

Next, referring to FIG. 7, an OLED display having a plurality of inclination angles will be described.

Figure 7:
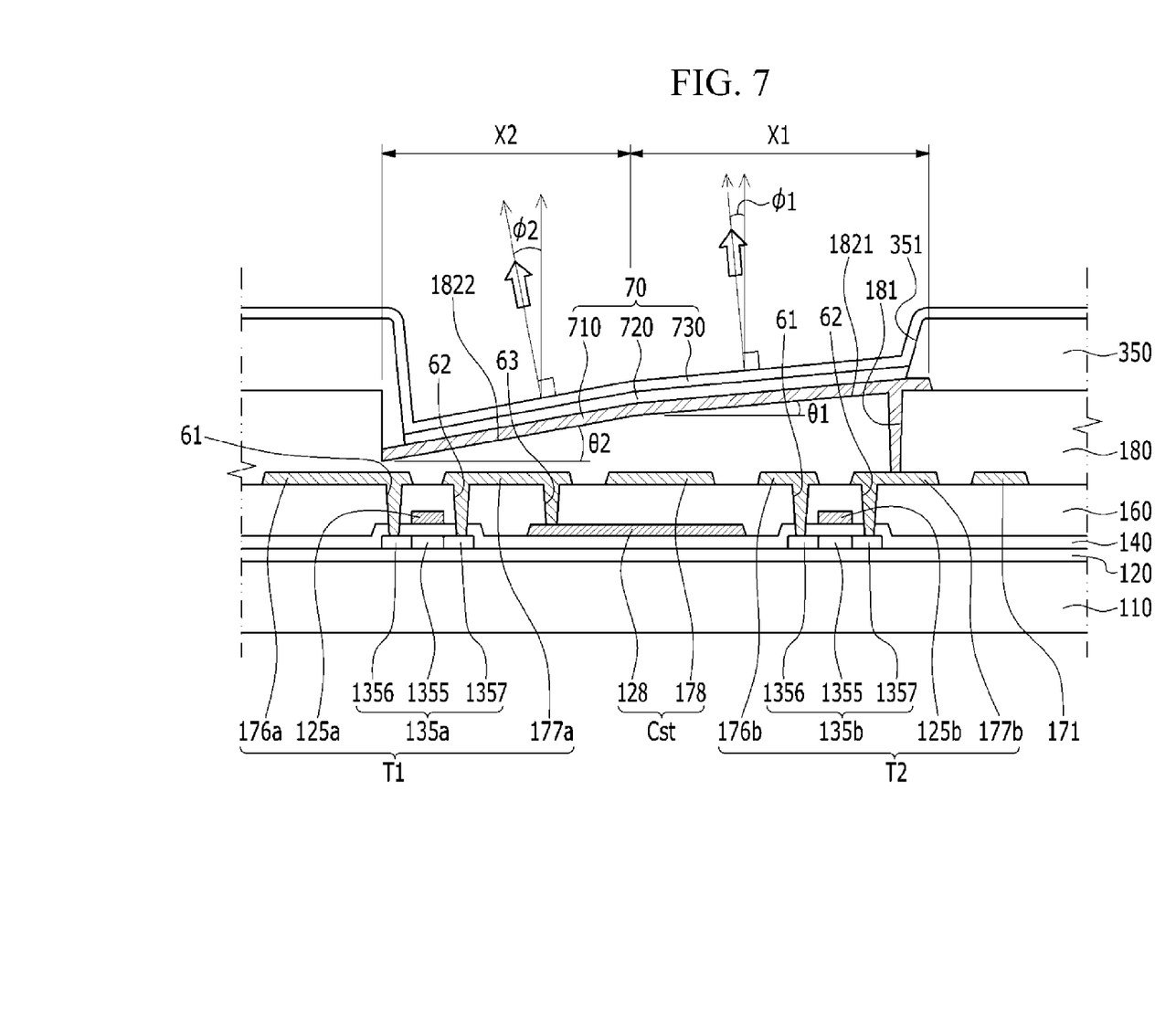
FIG. 7 is a cross-sectional view of a side pixel positioned at a side display part of an OLED display according to exemplary embodiments of the present disclosure.

FIG. 7 is a cross-sectional view of a side pixel A2 positioned at a side display part 20 of an OLED display according exemplary embodiments of the present disclosure.

The side pixel A2 of FIG. 7 is similar to the side pixel A2 of FIG. 6 except for a structure of the side OLED 70.

As shown in FIG. 7, at the protective layer 180 of the side pixel A2 of the OLED display, sub-inclination grooves 1821 and 1822 having an inclination angle θ1 and an inclination angle θ2, respectively, may be formed at a region X1 and a region X2, respectively.

The pixel electrode 710 of the first electrode may be disposed on the protective layer 180, and the pixel electrode 710 formed at the sub-inclination grooves 1821 and 1822 of the protective layer 180 of the side pixel A2 may be oblique. The inclination angle θ1 and the inclination angle θ2 may be different from each other. The organic emission layer 720 of the side pixel A2 may be disposed on the pixel electrode 710 on the sub-inclination grooves 1821 and 1822 such that the organic emission layer 720 is formed with the inclination angle θ1 and the inclination angle θ2. The common electrode 730 of the side pixel A2 may be disposed on the pixel electrode 710 and the organic emission layer 720 on the sub-inclination grooves 1821 and 1822, such that the common electrode 730 is formed with the inclination angle θ1 and the inclination angle θ2.

As described above, the pixel electrode 710, the organic emission layer 720, and is the common electrode 730 formed in the side pixel A2 may have an oblique inclination angle θ1 and an oblique inclination angle θ2 that are different from each other such that the maximum luminance may be obtained at viewing angles ϕ1 and ϕ2 inside the side pixel A2, which is formed in the side display part 20 and the bending display part 30.

In some cases, an inclination angle θ of the side OLED formed in a side red pixel, a side green pixel, and a side blue pixel may be different from each other.

Next, referring to FIG. 8, an OLED display with a side red pixel, a side green pixel, and a side blue pixel having different inclination angles θ will be described.

Figure 8:
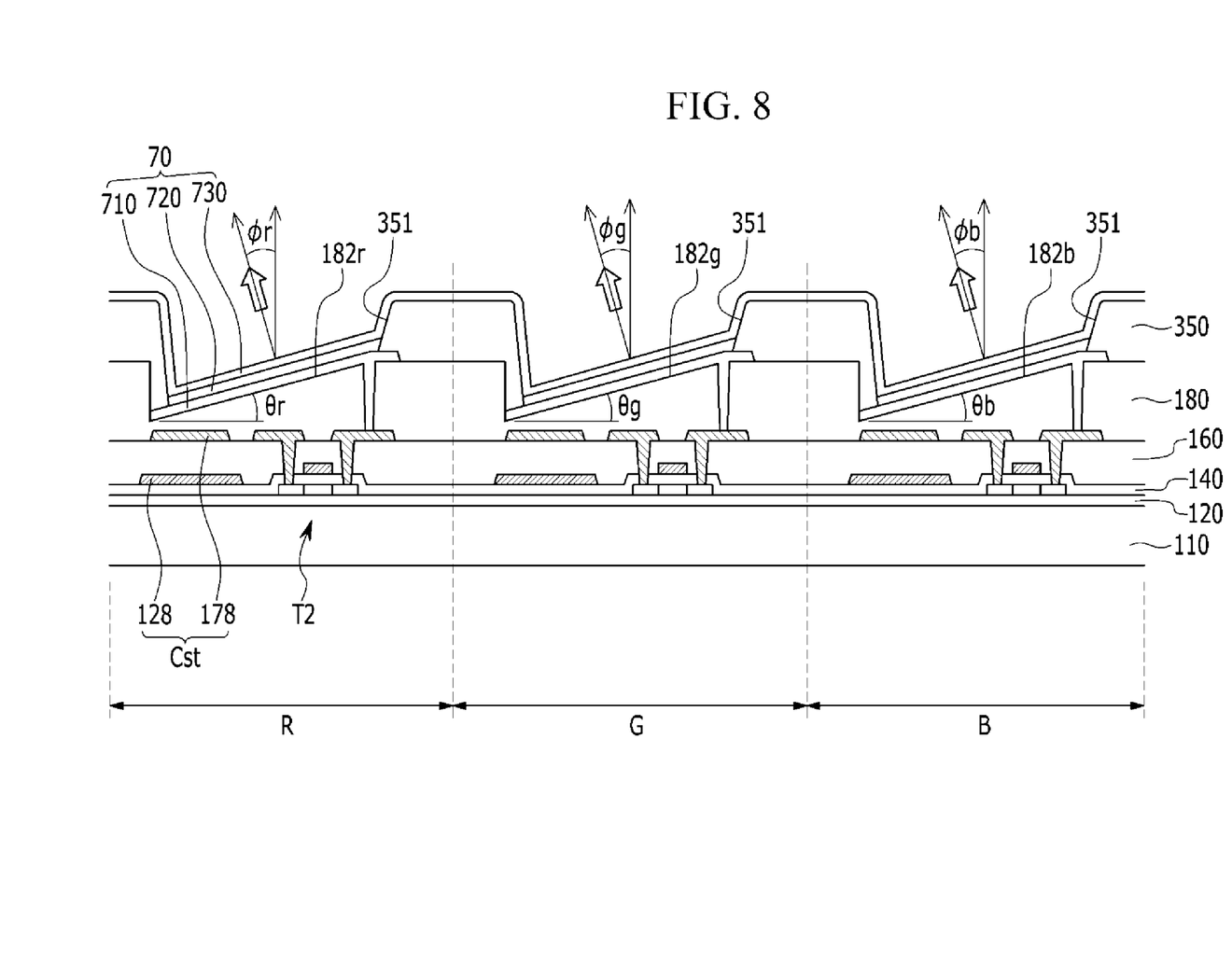
FIG. 8 is a cross-sectional view of a side red pixel, a side green pixel, and a side blue pixel of a side pixel positioned at a side display part of an OLED display according to exemplary embodiments of the present disclosure.

FIG. 8 is a cross-sectional view of a side red pixel, a side green pixel, and a side blue pixel of a side pixel A2 positioned at a side display part 20 of an OLED display according to exemplary embodiments of the present disclosure.

The side pixel A2 of FIG. 8 is similar to the side pixel A2 of FIG. 6 except for a structure of the side OLED 70.

As shown in FIG. 8, in the side pixel A2 of the OLED display, inclination grooves 182*r*, 182*g*, and 182*b* having different inclination angles θr, θg, and θb may be formed at the protective layer 180 of the side red pixel (R), the side green pixel (G), and the side blue pixel (B).

A pixel electrode 710 may be disposed on the protective layer 180 at the inclination grooves 182*r*, 182*g*, and 182*b* of the side red pixel (R), the side green pixel (G), and the side blue pixel (B), and may be oblique at different inclination angles θr, θg, and θb. The organic emission layer 720 of the side red pixel (R), the side green pixel (G), and the side blue pixel (B) may be disposed on the pixel electrode 710 at the different inclination angles θr, θg, and θb, respectively. The common electrode 730 of the side red pixel (R), the side green pixel (G), and the side blue pixel (B) may be disposed on the pixel electrode 710 and the organic emission layer 720 at the different inclination angles θr, θg, and θb, respectively.

As described above, the pixel electrode 710, the organic emission layer 720, and the common electrode 730 of side OLEDs 70 may be formed at the side red pixel (R), the side green pixel (G), and the side blue pixel (B), and may have different oblique inclination angles θr, θg, and θb such that the side red pixel (R), the side green pixel (G), and the side blue pixel (B) formed at the side display part 20 and the bending display part 30 may have the maximum luminance at the viewing angles ϕr, ϕg, and ϕb.

In some cases, the inclination angles θr, θg, and θb of the side OLED formed at the side red pixel (R), the side green pixel (G), and the side blue pixel (B) of the OLED display may be different from each other, and, in some cases, the inclination angles θr, θg, and θb may be the same. In some cases, the inclination angle θ of the side OLED formed in the side pixel A2 at the bending display part of the OLED display may be varied (e.g., gradually increased or decreased).

Figure 9:
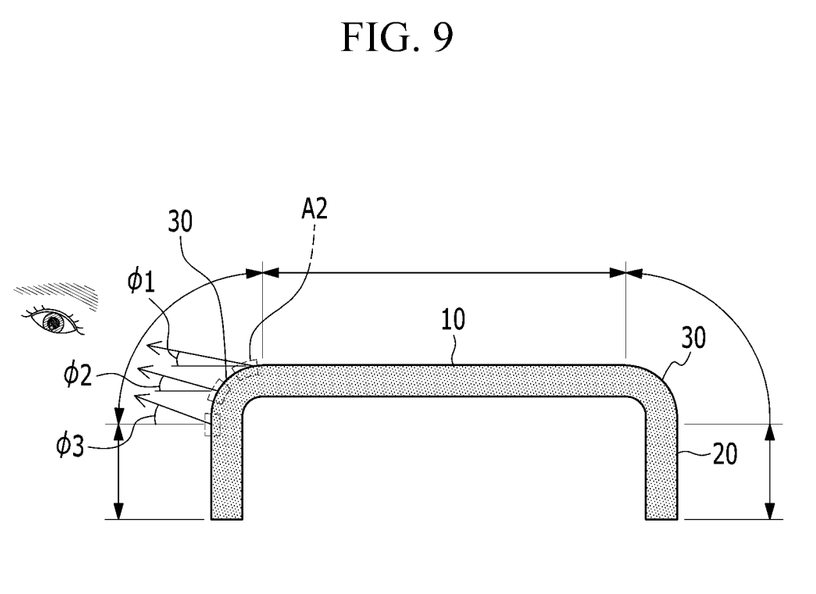
FIG. 9 is a side view of an OLED display according to exemplary embodiments of the present disclosure.

Referring to FIG. 9, an OLED display having varied inclination angles θ will be described.

FIG. 9 is a side view of an OLED display according to exemplary embodiments of the present disclosure.

As shown in FIG. 9, inclination angles θ1, θ2, and θ3 of the side OLED formed at three adjacent side pixels A2 at the bending display part 30 of the OLED display may be gradually increased. The inclination angles θ1, θ2, and θ3 may be increased such that three adjacent side pixels A2 formed at the bending display part 30 may have the maximum luminance at viewing angles ϕ1, ϕ2, and ϕ3.

In some cases, the inclination angles θ1, θ2, and θ3 may be gradually decreased. In general, an inclination angle θ may vary according to the position of a pixel in the side display part 20 and the bending display part 30 in the OLED display. For example, the inclination angle of a pixel in the side display part may be different (e.g., smaller or larger) than an inclination angle of a pixel in the bending display part.

It will be apparent to those skilled in the art that various modifications and variations can be made in the present disclosure without departing from the spirit or scope of the disclosed subject matter. Thus, it is intended that the present disclosure cover the modifications and variations of the disclosed subject matter provided they come within the scope of the appended claims and their equivalents.

What is claimed is:

1. An organic light emitting diode (OLED) display, comprising:
a front display part comprising a plurality of front pixels configured to provide an image at a first side of the OLED display; and
a side display part comprising a plurality of side pixels configured to provide the image at a second side of the OLED display,
wherein each of the plurality of side pixels comprises:
a plurality of thin film transistors;
a protective layer covering the plurality of thin film transistors and having an inclination groove such that a top surface of the protective layer is linearly oblique with respect to a bottom surface of the protective layer;
a first electrode disposed on the inclination groove;
a pixel defining layer disposed on the protective layer and having an opening exposing the first electrode;
an organic emission layer disposed on the first electrode and the pixel defining layer; and
a second electrode disposed on the organic emission layer,
wherein a side OLED comprises the first electrode, the organic emission layer, and the second electrode, and is configured to be oblique, and
wherein at least one of the side pixels comprises a side red pixel, a side green pixel, and a side blue pixel, inclination angles of the side red pixel, the side green pixel, and the side blue pixel being different from each other.

2. The OLED display of claim 1, wherein:
an inclination angle of the side OLED is in a range of 5 degrees to 70 degrees.

3. The OLED display of claim 2, wherein:
the inclination groove comprises a plurality of sub-inclination grooves having different inclination angles.

4. An organic light emitting diode (OLED) display, comprising:
a front display part comprising a plurality of front pixels configured to provide an image at a first side of the OLED display; and
a side display part comprising a plurality of side pixels configured to provide the image at a second side of the OLED display,
wherein each of the plurality of side pixels comprises:
a plurality of thin film transistors;
a protective layer covering the plurality of thin film transistors and having an inclination groove such that a top surface of the protective layer is linearly oblique with respect to a bottom surface of the protective layer;
a first electrode disposed on the inclination groove;
a pixel defining layer disposed on the protective layer and having an opening exposing the first electrode;
an organic emission layer disposed on the first electrode and the pixel defining layer; and
a second electrode disposed on the organic emission layer,
wherein a side OLED comprises the first electrode, the organic emission layer, and the second electrode, and is configured to be oblique, and
wherein the inclination angles of the side OLEDs sequentially increase or sequentially decrease based on positions of the side OLEDs.

5. A pixel, comprising:
a first pixel, a second pixel, and a third pixel configured to emit a color of light different from one another, each of the first, second, and third pixels comprising:
at least one switching element;
a protective layer disposed on the at least one switching element;
an organic light emitting diode (OLED) disposed on the protective layer, the OLED comprising a bottom electrode; and
a pixel defining layer disposed on the protective layer and comprising an opening that overlaps the bottom electrode of the OLED,
wherein an entire portion of the protective layer overlapping the opening is linearly inclined at an inclination angle relative to a bottom surface of the protective layer,
wherein the bottom electrode contacts with the top surface of the protective layer, is inclined at the inclination angle, and is connected to the at least one switching element, and
wherein the inclination angles of the bottom electrode of the first, second, and third pixels are different from one another.

6. The pixel of claim 5, wherein:
the OLED further comprises an organic emission layer disposed on the bottom electrode, and a second electrode disposed on the organic emission layer; and
the second electrode and the organic emission layer are inclined at the inclination angle.

7. The pixel of claim 5, wherein:
the inclination angle is oblique.

8. An organic light emitting diode (OLED) display, comprising:
a front display part;
a side display part; and
a bending display part connecting the front display part and the side display part,
wherein each of the front display part, the side display part, and the bending display part comprises a plurality of pixels, each of the plurality of pixels comprising at least one switching element, a protective layer disposed on the at least one switching element, and an OLED disposed on the protective layer,
wherein, in pixels of the front display part, a top surface of the OLED is parallel to a bottom surface of the protective layer, and
wherein, in a pixel of the side display part or the bending display part, a top surface of the protective layer is inclined at an inclination angle with respect to the bottom surface of the protective layer, and a top surface of the OLED is inclined with respect to the bottom surface of the protective layer.

9. The OLED display of claim 8, wherein:
in the pixel of the side display part or the bending display part, the protective layer comprises at least two inclination grooves corresponding to at least two inclination angles in the protective layer.

10. The OLED display of claim 8, wherein:
in the pixel of the side display part or the bending display part, a first portion of the top surface of the protective layer is inclined at a different angle than a second portion of the top surface of the protective layer;
a first portion of the top surface of the OLED is inclined at a different angle than a second portion of the top surface of OLED; and
the first portion of the top surface of the protective layer is parallel to the first portion of the top surface of the OLED.

11. The OLED display of claim 8, wherein:
the inclination angle comprises an oblique angle.

12. The OLED display of claim 8, wherein:
in adjacent pixels of the side display part or the bending display part, the inclination angle is sequentially increased or sequentially decreased.

13. The OLED display of claim 8, wherein:
the inclination angle of the protective layer in a pixel in the side display part is different than the inclination angle of the protective layer in a pixel in the bending display part.

14. The OLED display of claim 8, wherein:
at least one pixel of the side display part or the bending display part comprises a red pixel, a green pixel, and a blue pixel;
the top surface of the protective layer in the red pixel is inclined at a first inclination angle;
the top surface of the protective layer in the green pixel is inclined at a second inclination angle; and
the top surface of the protective layer in the blue pixel is inclined at a third inclination angle.

15. The OLED display of claim 14, wherein:
the first inclination angle, the second inclination angle, and the third inclination angle are different from each other.

16. An organic light emitting diode (OLED) display, comprising:
a front display part;
a side display part; and
a bending display part connecting the front display part and the side display part,
wherein the front display part comprises a plurality of first pixels, each of the plurality of first pixels comprising a first OLED disposed on a first protective layer, the first OLED forming a first inclination angle with respect to a bottom surface of the first protective layer,
wherein each of the side display part and the bending display part comprises a second OLED disposed on a second protective layer, the second OLED forming a second inclination angle with respect to a bottom surface of the second protective layer,
wherein the first inclination angle is different from the second inclination angle, and
wherein the second inclination angle corresponds to a location of the second OLED.

17. The OLED display of claim 16, wherein:
the second OLED comprises a first electrode, an organic emission layer, and a second electrode; and
the first electrode, the organic emission layer, and the second electrode are oblique with respect to the bottom surface of the second protective layer.

\* \* \* \* \*

UNITED STATES PATENT AND TRADEMARK OFFICE
CERTIFICATE OF CORRECTION

PATENT NO. : 9,570,527 B2  
APPLICATION NO. : 14/063702  
DATED : February 14, 2017  
INVENTOR(S) : Jun Namkung Page 1 of 1

It is certified that error appears in the above-identified patent and that said Letters Patent is hereby corrected as shown below:

On the Title Page

There should be item -- (30) Foreign Application Priority Data, Jul 1, 2013 (KR) 10-2013-0076610 --

Signed and Sealed this  
Sixth Day of March, 2018

Andrei Iancu  
*Director of the United States Patent and Trademark Office*